United States Patent
Otsuka et al.

(10) Patent No.: US 7,692,298 B2
(45) Date of Patent: Apr. 6, 2010

(54) III-V NITRIDE SEMICONDUCTOR DEVICE COMPRISING A CONCAVE SHOTTKY CONTACT AND AN OHMIC CONTACT

(75) Inventors: Koji Otsuka, Kawagoe (JP); Shinichi Iwakami, Iruma-gun (JP)

(73) Assignee: Sanken Electric Co., Ltd., Saitama-ken (JP)

( * ) Notice: Subject to any disclaimer, the term of this patent is extended or adjusted under 35 U.S.C. 154(b) by 287 days.

(21) Appl. No.: 10/573,458

(22) PCT Filed: Aug. 25, 2005

(86) PCT No.: PCT/JP2005/015405

§ 371 (c)(1),
(2), (4) Date: Mar. 24, 2006

(87) PCT Pub. No.: WO2006/038390

PCT Pub. Date: Apr. 13, 2006

(65) Prior Publication Data

US 2007/0051938 A1   Mar. 8, 2007

(30) Foreign Application Priority Data

Sep. 30, 2004   (JP) ............................... 2004-289248

(51) Int. Cl.
*H01L 23/48* (2006.01)
(52) U.S. Cl. .............................. 257/745; 257/E29.144; 257/E29.149; 438/571
(58) Field of Classification Search ................ 257/745, 257/E29.144, E29.149, 11, 14, 200, 201, 257/471, 473, 615, E33.023, E33.049, E31.019, 257/E29.089, E21.085, E21.173; 438/571, 438/167, 570, 604
See application file for complete search history.

(56) References Cited

U.S. PATENT DOCUMENTS 4,636,823 A * 1/1987 Margalit et al. ............. 257/192

(Continued)

FOREIGN PATENT DOCUMENTS

GB    2279806 A  *  1/1995

(Continued)

OTHER PUBLICATIONS

Peatman, W. C. B. et al. "A Novel Schottky/2-DEG Diode for Millimeter- and Submillimeter-Wave Multiplier Applications." IEEE Electron Device Letters, vol. 13, No. 1. Jan. 1992.*

(Continued)

*Primary Examiner*—Leonardo Andújar
*Assistant Examiner*—Christopher M Roland
(74) *Attorney, Agent, or Firm*—Wood, Herron, Evans, L.L.P.

(57) ABSTRACT

A two-dimensional carrier is generated in the vicinity of an interface that is a hetero interface between a semiconductor layer and a semiconductor layer. Two concave portions are formed so as to extend from a primary surface as far as the interface. An electrode that is made of metal and provides a Schottky junction with the semiconductor layers is formed on a bottom surface and a side surface of the concave portion. An electrode that is made from metal and provides a low resistance contact with the semiconductor layers and is also in low resistance contact therewith is formed on the bottom surface and side surface of the concave portion. As a result, a semiconductor device is provided in which contact resistance between the electrodes and the semiconductor layers is reduced and high frequency characteristics are improved.

10 Claims, 5 Drawing Sheets

U.S. PATENT DOCUMENTS

| | | | | |
|---|---|---|---|---|
| 4,677,457 | A | * | 6/1987 | Wolter .................. 257/194 |
| 4,772,925 | A | * | 9/1988 | Fukuzawa et al. ........... 257/194 |
| 5,099,295 | A | * | 3/1992 | Ogawa .................. 257/24 |
| 5,105,241 | A | * | 4/1992 | Ando .................. 257/194 |
| 5,408,106 | A | * | 4/1995 | Seabaugh .................. 257/17 |
| 5,504,347 | A | * | 4/1996 | Jovanovic et al. ............. 257/25 |
| 5,742,077 | A | * | 4/1998 | Patel et al. .................. 257/194 |
| 2003/0098462 | A1 | * | 5/2003 | Yoshida .................. 257/183 |
| 2005/0139838 | A1 | * | 6/2005 | Murata et al. .................. 257/73 |
| 2005/0194612 | A1 | * | 9/2005 | Beach .................. 257/192 |
| 2005/0263789 | A1 | * | 12/2005 | Hwang .................. 257/194 |
| 2006/0006413 | A1 | * | 1/2006 | Beach .................. 257/192 |
| 2006/0019435 | A1 | * | 1/2006 | Sheppard et al. ............ 438/167 |
| 2006/0060871 | A1 | * | 3/2006 | Beach .................. 257/94 |
| 2006/0065908 | A1 | * | 3/2006 | Beach .................. 257/107 |
| 2006/0108659 | A1 | * | 5/2006 | Yanagihara et al. ......... 257/471 |
| 2007/0228401 | A1 | * | 10/2007 | Machida et al. .............. 257/96 |
| 2007/0284653 | A1 | * | 12/2007 | Ueno et al. .................. 257/324 |

FOREIGN PATENT DOCUMENTS

| | | | | |
|---|---|---|---|---|
| JP | 62213279 | A | * | 9/1987 |
| JP | 03-16179 | | | 1/1991 |
| JP | 2003016179 | | | 1/1991 |
| JP | 2001102565 | A | * | 4/2001 |
| JP | 2003100778 | | | 4/2003 |
| JP | 2003229566 | | | 8/2003 |

OTHER PUBLICATIONS

Koh, P. J. et al. "Millimeter Wave Tripler Evaluation of a Metal/2-DEG Schottky Diode Varactor." IEEE Microwave and Guided Wave Letters, vol. 5, No. 2. Mar. 1995.*

Castro, F. et al. "Schottky Contact between Metal and Two-Dimensional Electron Gas: Device Applications to Low-Noise Optical Detectors." IEEE MTT-S IMOC '97 Proceedings. 1997.*

Anwar, A. et al. "Barrier Enhancement Mechanisms in Heterodimensional Contacts and their Effect on Current Transport." IEEE Transactions on Microwave Theory and Techniques, vol. 50, No. 1. Jan. 2002.*

Daniels, R. et al. "Quantum-Well p-Channel AlGaAs/InGaAs/GaAs Heterostructure Insulated-Gate Field-Effect Transistors with Very High Transconductance." IEEE Electron Device Letters, vol. 9, No. 7. Jul. 1988.*

Chen, W. et al. "High-Performance AlGan/GaN Lateral Field-Effect Rectifiers Compatible with High Electron Mobility Transistors". Applied Physics Letters 92, 253501. Jun. 2008.*

US Patent and Trademark Office, Published Patent Application No. 2003/0098462 to Yoshida, *III-V Nitride Semiconductor Device, and Protection Element and Power Conversion Apparatus Using the Same*, published May 29, 2003.

International Search Authority Report, PCT/JP20055/015405, Nov. 8, 2005.

* cited by examiner

III-V NITRIDE SEMICONDUCTOR DEVICE COMPRISING A CONCAVE SHOTTKY CONTACT AND AN OHMIC CONTACT

TECHNICAL FIELD

The present invention relates to a semiconductor device that uses a group III nitride semiconductor material and, in particular, to a semiconductor device that achieves an improvement in operating characteristics.

Priority is claimed on Japanese Patent Application No. 2004-289248, filed Sep. 30, 2004, the contents of which are incorporated herein by reference.

BACKGROUND ART

Group III nitride semiconductors, a typical example of which is GaN, have a dielectric breakdown field strength that is approximately 10 times greater than that of conventional Si, and their saturation drift velocity is approximately 3 times greater than that of conventional Si which is excellent from the viewpoint of mobility. Because of this, group III nitride semiconductors have attracted attention as a semiconductor material for high frequency—high output devices. FIG. 9 shows a cross-sectional structure of a conventional semiconductor device 2 that uses a nitride semiconductor. A buffer layer 22 that is formed from a nitride semiconductor material is formed on a substrate 21. A semiconductor layer 23 that is formed from a nitride semiconductor material such as GaN is formed on the buffer layer 22.

A semiconductor layer 24 that is formed from a nitride semiconductor material such as $Al_xGa_{1-x}N$ ($0<X\leqq1$) is formed on the semiconductor layer 23. Electrodes 25 and 26 are formed on a primary surface 200 of the semiconductor layer 24. A polarization charge is generated by the spontaneous polarization of the nitride semiconductor on an interface 201 at a boundary between the semiconductor layer 23 and the semiconductor layer 24. Furthermore, piezoelectric polarization (also known as piezoelectric field polarization) is generated in the vicinity of the interface 201 by distortion that is generated by the difference between the lattice constant of the nitride semiconductor of the semiconductor layer 23 and the lattice constant of the nitride semiconductor of the semiconductor layer 24. As a result, a two-dimensional carrier (also known as a two-dimensional electron gas layer or a two-dimensional hole gas layer) 202 is generated based on these polarization charges in the vicinity of the interface between the semiconductor layer 23 and the semiconductor layer 24.

This distortion is caused by mechanical tensile stress that is generated in the semiconductor layer 24 as a result of the difference between the size of the lattice of the semiconductor layer 23 and the size of the lattice of the semiconductor layer 24, and this distortion contributes to the piezoelectric polarization. Because the semiconductor layer 23 and the semiconductor layer 24 have considerable band gap energy, a high density two-dimensional carrier is generated in the vicinity of the interface 201. Note that a semiconductor having a similar structure to that described above is described in Japanese Unexamined Patent Application, First Publication No. 2003-100778.

However, in a conventional semiconductor device that uses a nitride semiconductor material, the internal resistance inside the semiconductor between the electrodes that are provided on the semiconductor layers and the two-dimensional carrier is comparatively large and the problem has existed that it has not been possible to sufficiently lower the forward voltage. Moreover, parasitic capacitance is generated between the electrodes and the two-dimensional carrier and the problem has also existed that this has also affected the high frequency characteristics of the semiconductor device.

DISCLOSURE OF INVENTION

The present invention was conceived in view of the above described problems, and it is an object thereof to provide a semiconductor device that is able to sufficiently lower the forward voltage and provide improved high frequency characteristics.

The present invention was conceived in order to solve the above described problems. The present invention is a semiconductor device that includes: a first semiconductor layer that is formed from a first semiconductor material; a second semiconductor layer that is formed from a second semiconductor material on the first semiconductor layer; a two-dimensional carrier that is formed within the first semiconductor layer and in the vicinity of an interface between the first semiconductor layer and the second semiconductor layer; a first concave portion that is formed extending from a primary surface of the second semiconductor layer that faces the interface between the first semiconductor layer and the second semiconductor layer as far as the interface; a first electrode that is formed on a bottom surface and side surface of the first concave portion and that forms a Schottky junction between the first and second semiconductor layers; and a second electrode that is formed in an area of the second semiconductor layer that is located away from the first electrode and that forms a low resistance contact with the second semiconductor layer.

In the present invention, it is also possible for the first electrode to be formed so as to extend from the primary surface of the second semiconductor layer as far as the two-dimensional carrier, or to be formed so as to face the two-dimensional carrier and be separated therefrom by a distance that allows a quantum mechanical tunnel effect to be obtained.

Moreover, the present invention is a semiconductor device that includes: a first semiconductor layer that is formed from a first semiconductor material; a second semiconductor layer that is formed from a second semiconductor material on the first semiconductor layer; a third semiconductor layer that is sandwiched between the first semiconductor layer and the second semiconductor layer and that is formed having a thickness that allows a quantum mechanical tunnel effect to be obtained; a two-dimensional carrier that is formed within the first semiconductor layer and on the third semiconductor layer side of the first semiconductor layer; a first concave portion that is formed extending from a primary surface of the second semiconductor layer that faces the interface between the third semiconductor layer and the second semiconductor layer as far as the interface; a first electrode that is formed on a bottom surface and side surface of the first concave portion and that forms a Schottky junction between the first and second semiconductor layers; and a second electrode that is formed in an area of the second semiconductor layer that is located away from the first electrode and that forms a low resistance contact with the second semiconductor layer.

In the present invention, it is also possible for there to be further provided a second concave portion that is formed extending from the primary surface of the second semiconductor layer as far as the interface between the first semiconductor layer and the second semiconductor layer, and for the second electrode to be formed on a bottom surface and side surface of the second concave portion.

In the present invention, it is also possible for there to be further provided a second concave portion that is formed extending from the primary surface of the second semiconductor layer as far as the interface between the third semiconductor layer and the second semiconductor layer, and for the second electrode to be formed on a bottom surface and side surface of the second concave portion.

In the present invention, it is also possible for the second electrode to be formed so as to extend from the primary surface of the second semiconductor layer as far as the two-dimensional carrier.

In the present invention, it is also possible for there to be further provided a second concave portion that is formed extending from the primary surface of the second semiconductor layer as far as the two-dimensional carrier, and for the second electrode to be formed on the bottom surface and side surface of the second concave portion, and to be formed so as to extend from the primary surface of the second semiconductor layer as far as the two-dimensional carrier.

In the present invention, it is also possible for the second electrode to be formed so as to sandwich and face the first electrode when viewed from a perpendicular direction relative to the primary surface.

In the present invention, it is also possible for the second electrode to be formed so as to surround the first electrode when viewed from a perpendicular direction relative to the primary surface.

In the present invention, it is also possible for the first electrode to be also formed on the primary surface of the second semiconductor layer that surrounds the first concave portion.

According to the present invention, because electrodes are formed in concave portions that reach as far as an interface between two semiconductor layers where a two-dimensional carrier is formed, it is possible to reduce the internal resistance within a semiconductor layer between the electrodes and the two-dimensional carrier, and reduce the forward voltage. The effects are also obtained that it is possible to reduce parasitic capacitance and improve high frequency characteristics.

BEST MODE FOR CARRYING OUT THE INVENTION

Figure 1:
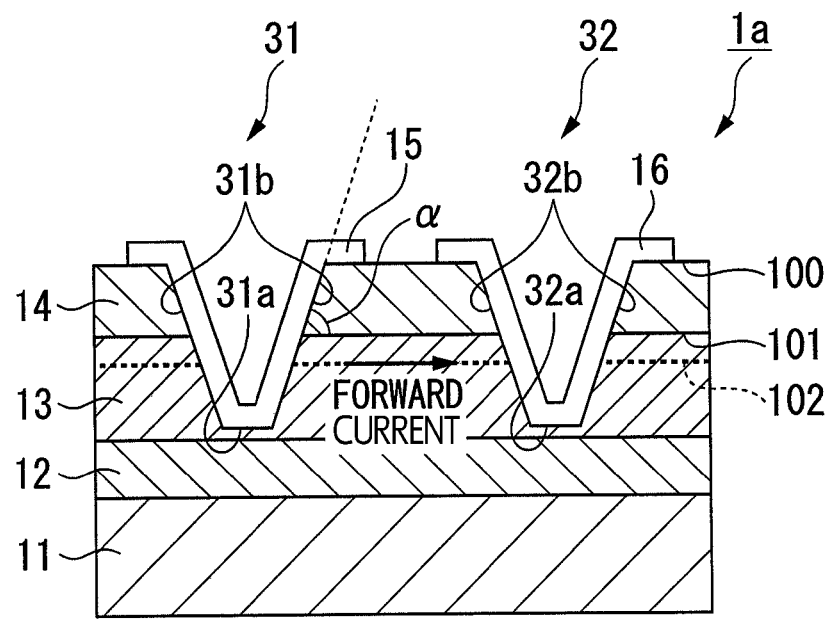
FIG. 1 is a cross-sectional view showing the cross-sectional structure of a semiconductor device according to the first embodiment of the present invention.

Preferred embodiments for implementing the present invention will now be described with reference made to the drawings. FIG. 1 shows the cross-sectional structure of a semiconductor device 1a according to the first embodiment of the present invention. Each of the structures in the drawings is described below. A buffer layer 12 formed by a nitride semiconductor is formed on a substrate 11 that is formed, for example, from Si, SiC, or sapphire. A semiconductor layer 13 (i.e., a first semiconductor layer) that is formed from a nitride semiconductor material such as, for example, GaN is formed on the buffer layer 12.

A semiconductor layer 14 (i.e., a second semiconductor layer) that is formed by a nitride semiconductor such as, for example, $Al_xGa_{1-x}N$ ($0<X\leq1$) and that has greater band gap energy than the semiconductor layer 13 is formed on the semiconductor layer 13. An interface 101 that constitutes a boundary face between the semiconductor layer 13 and the semiconductor layer 14 is a hetero interface that is formed by the semiconductor layer 13 and the semiconductor layer 14. A high density two-dimensional carrier 102 is generated by the effects of spontaneous polarization and piezoelectric polarization within an area of the semiconductor layer 13 located in the vicinity of the interface 101 between the semiconductor layer 13 and the semiconductor layer 14.

A concave portion 31 (i.e., a first concave portion) and a concave portion 32 (i.e., a second concave portion) are formed on a primary surface 100 of the semiconductor layer 14 that faces the interface 101. A bottom surface 31a of the concave portion 31 and a bottom surface 32a of the concave portion 32 are formed so as to reach from the primary surface 100 at least as far as the interface 101. In the present embodiment, they are formed below (i.e., on the substrate 11 side) the position of the interface 101.

An electrode 15 (i.e., a first electrode) that is made from metal and forms a Schottky junction with the semiconductor layers 13 and 14 is formed on the bottom surface 31a and side surfaces 31b of the concave portion 31. An electrode 16 (i.e., a second electrode) that is made from metal and forms a low resistance contact with the semiconductor layers 13 and 14 and is also in low resistance contact therewith is formed on the bottom surface 32a and side surfaces 32b of the concave portion 32. A portion of the electrode 15 is formed on the primary surface 100 so as to surround the concave portion 31. In addition, a portion of the electrode 16 is formed on the primary surface 100 so as to surround the concave portion 32. The electrode 15 and the electrode 16 are not in contact with each other. The electrode 15 and the electrode 16 are formed by depositing metal respectively onto the concave portions 31 and 32, and then patterning the metal into the desired shape by etching.

The bottom surface 31a of the concave portion 31 and the bottom surface 32a of the concave portion 32 are formed so as to reach from the primary surface 100 at least as far as the depth of the interface 101. It is more desirable that the bottom surface 31a and the bottom surface 32a are formed so as to reach from the primary surface 100 to the two-dimensional carrier 102. By employing this structure, as is described below, the electrode 15 and the electrode 16 are in direct electrical contact via the two-dimensional carrier 102 by being in contact with the two-dimensional carrier 102, so that it is possible to reduce the forward voltage. However, if the concave portions 31 and 32 are formed too deeply, an extended etching time becomes necessary, therefore, it is necessary for them to be formed to an appropriate depth.

Note that even if the bottom surface 31a and the bottom surface 32a are not formed so as to reach the two-dimensional carrier 102, if they are formed so as to reach the interface 101, current flows between the bottom surfaces 31a and 32a and the two-dimensional carrier 102 due to a tunnel effect. As a result, the forward voltage can be reduced. In this case, it is desirable that the distance in a vertical direction (i.e., a perpendicular direction relative to the bottom surface 31a) between the bottom surface 31a of the concave portion 31 and the two-dimensional carrier is 100 angstroms or less, and more desirably 60 angstroms or less. The depths of the concave portions 31 and 32 do not have to be the same, however, generally, the number of manufacturing steps can be reduced if the concave portions are formed at the same time. It is, therefore, desirable that the depths of these concave portions are the same.

Figure 2:
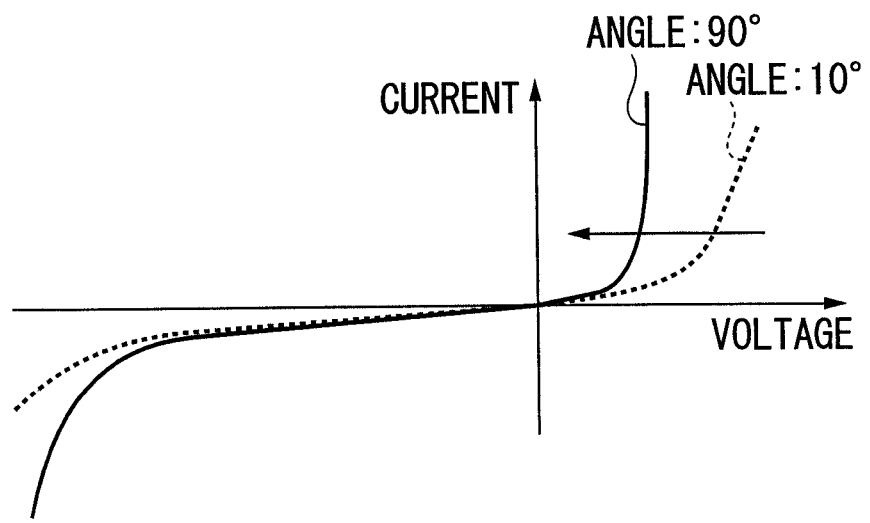
FIG. 2 is a reference view showing current and voltage characteristics of the semiconductor device according to the first embodiment of the present invention.

It is desirable that an angle $\alpha$ between a side surface 31b of the concave portion 31 and the interface 101 is between 10° and 90°. If the angle $\alpha$ is less than 10°, then because the carrier density of the two-dimensional carrier decreases as the size of the angle decreases, the forward voltage reduction effect is not sufficiently in evidence. If the angle $\alpha$ is greater than 90°, then it becomes difficult to form an electrode satisfactorily on the side surface 31b of the concave portion 31. By changing the angle $\alpha$, the forward characteristics can be changed as is shown in FIG. 2. The same also applies to the angle formed by the side surface 32b of the concave portion 32 relative to the interface 101. The angle formed by the side surface 31b of the concave portion 31 relative to the interface 101 does not need to be the same as the angle formed by the side surface 32b of the concave portion 32 relative to the interface 101, however, if they are the same, the manufacturing process is easier.

The concave portions 31 and 32 may be formed, for example, in the manner described below. After the semiconductor layer 14 has been formed, resist is coated thereon, and the surface of the semiconductor layer 14 in the areas where the concave portions 31 and 32 are to be formed is exposed to form aperture portions. The remainder of the surface forms a resist pattern that is covered by resist. At this time, the pattern is formed such that the thickness of the resist at the periphery of the aperture portions becomes thinner in steps the closer it comes to the aperture portion. Next, dry etching of the semiconductor layer 14 is performed. In this process, the resist is also etched by the action of the reaction gas that is used in the etching so that the aperture portion becomes gradually larger. As a result, the etching of the newly exposed semiconductor layer 14 advances and, ultimately, the side surfaces 31b and 32b are formed. The angle formed by the edges of this pattern, in which the thickness of the resist becomes thinner in steps, relative to the primary surface 100 of the semiconductor layer 14 can be controlled, for example, by raising the temperature during post baking.

Figure 3:
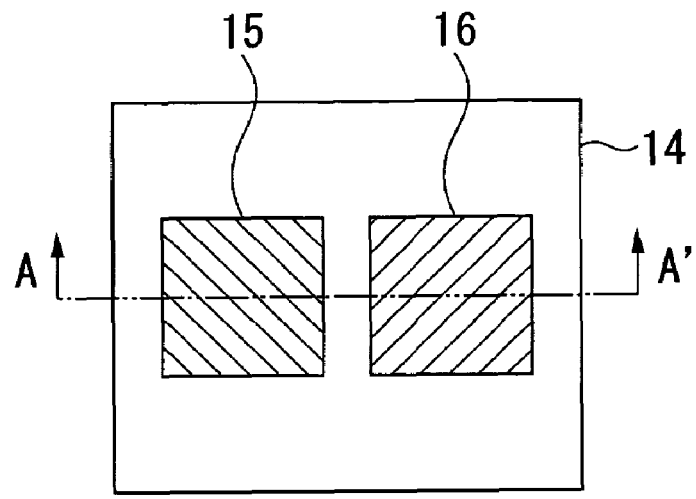
FIG. 3 is a schematic plan view of the semiconductor device according to the first embodiment of the present invention.

FIG. 3 is a schematic plan view as seen from a perpendicular direction relative to the primary surface 100 of the semiconductor device 1a of the present embodiment. The electrodes 15 and 16 are formed adjacent to each other on the semiconductor layer 14. FIG. 1 is a cross-section taken along the line segment A-A'. The shape of the electrodes 15 and 16 is not limited to a square shape, such as that shown in FIG. 3, and, for example, a circular shape may also be used.

Next, a description will be given of the operation of the semiconductor device 1a of the present embodiment. When voltage is applied in the forward direction (for example, when a positive charge is applied to the electrode 15 and a negative charge is applied to the electrode 16), then current flows from the electrode 15 to the two-dimensional carrier 102 to the electrode 16, as is shown by the arrow in FIG. 1. Because the two-dimensional carrier 102 has a high carrier density and can be regarded as being substantially the same as a metal layer, and because the electrode 15 and the two-dimensional carrier 102 are in direct contact, the path of the forward current can virtually be regarded as being a metal to metal contact, so that the forward voltage of the semiconductor device 1a can be kept at a low level.

Figure 4:
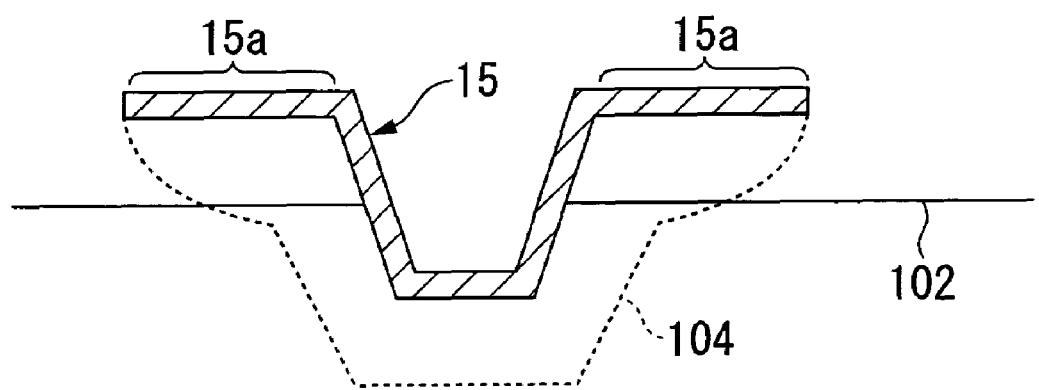
FIG. 4 is a schematic cross-sectional view showing a state when reverse voltage is applied to the semiconductor device according to the first embodiment.

When voltage is applied to the semiconductor device 1a in the reverse direction (for example, when a negative charge is applied to the electrode 15 and a positive charge is applied to the electrode 16), then a depletion layer spreads at the interface between the electrode 15 and the semiconductor layers 13 and 14. Furthermore, generally, if the reverse voltage is increased, then leakage current increases. However, as is shown in FIG. 4, in a portion (i.e., the electrode 15a) of the electrode 15 that is formed on the primary surface 100, if this electrode 15a is formed extending to a predetermined distance from the concave portion 31, then a depletion layer that is spread out by the electrode 15 having a Schottky barrier that has been placed on the primary surface 100 becomes connected to the above depletion layer, thereby forming a larger depletion layer 104.

As a result of this structure being employed, when voltage is applied in the reverse direction, the electrical contact between the two-dimensional carrier 102 and the electrode 15 is broken, and it becomes difficult for current to flow between the two-dimensional carrier 102 and the electrode 15. Accordingly, according to the semiconductor device 1a of the present embodiment, excellent voltage resistance characteristics can be ensured while low forward voltage is maintained.

When creating a two-dimensional carrier, it is vital that crystal growth is performed stably on a nitride semiconductor layer that has few crystal defects. Accordingly, it is normal for an AlGaN/GaN interface to be formed by continuous growth. In the semiconductor device 1a that is formed in this manner, high density two-dimensional carriers are generated stably, and it is easy to keep the properties of the semiconductor devices 1a uniform. Moreover, because the high density two-dimensional carriers form a low resistance current flow path and contribute to an increase in the forward current, it is possible to reduce the forward voltage of the semiconductor device 1a.

Note that it is desirable that the position of a bottom end (i.e., the bottom surface 31a) of the concave portion 31 is on the semiconductor layer 14 side of the interface between the buffer layer 12 and the semiconductor layer 13. As an example thereof, when the thickness of the semiconductor layer 13 is 500 nm, it is desirable that the distance between the bottom end of the concave portion 31 and the interface between the buffer layer 12 and the semiconductor layer 13 is 50 nm or more.

As is described above, in the present embodiment, the electrodes 15 and 16 are formed to a depth that extends from the primary surface 100 of the semiconductor layer 14 to the interface 101 between the semiconductor layer 13 and the semiconductor layer 14. As a result, the connection between the electrodes 15 and 16 and the two-dimensional carrier 102 having a high carrier density that is generated adjacent to the interface 101 can be made into a low resistance connection (namely, the contact resistance between the electrodes 15 and 16 and the semiconductor layers 13 and 14 is lowered), and the forward voltage of the semiconductor device 1a can be reduced.

Moreover, although the reason why the forward characteristics are changed by changing the angle α (i.e., the inclination) that the contact surface between the electrode 15 and the semiconductor layers 13 and 14 forms relative to the interface 101 is not completely clear, it may be thought to be as follows. Namely, a two-dimensional carrier is formed by a piezopolarization electric field that is created when tensile distortion is created in the semiconductor layer 14 by the difference between lattice constants of the semiconductor layer 13 and the semiconductor layer 14, and a plus charge is generated on the semiconductor layer 13 side of the semiconductor layer 14 and a minus charge is generated on the side of the semiconductor layer 14 that is located away from the semiconductor layer 13. In addition, the carrier density of the two-dimensional carriers increases as the size of this piezopolarization electric field increases, namely, as the tensile distortion created in the semiconductor layer 14 increases. Here, if the size of the angle α that the contact surface between the electrode 15 and the semiconductor layers 13 and 14 forms relative to the interface 101 increases, then the total amount of the tensile distortion created in the semiconductor layer 14 also increases. As a result, the carrier density of the two-dimensional carriers increases, the resistance value of the two-dimensional carriers is lowered, and the forward voltage can be reduced.

By replacing the electrode material, the current—voltage characteristics (i.e., the Schottky characteristics) of the semiconductor device 1a can also be altered, however, because the characteristics are to a certain extent determined by the type of electrode material and cannot be changed, if an attempt is made to obtain the desired characteristics simply by altering the electrode material, it becomes difficult to select an electrode material that enables characteristics matching the desired characteristics to be obtained. Moreover, depending on the type of electrode material that is used, there may also be a slight difference in the dispersion of characteristics between individual electrodes. In contrast to this, according to the semiconductor device 1a of the present embodiment, because it is possible to change the angle α to a desired value comparatively easily by altering the etching conditions when forming the concave portion 31, the desired characteristics can be easily obtained and any difference in the dispersion of characteristics between individual electrodes can be suppressed.

The high frequency characteristics of the semiconductor device 1a improve as the parasitic capacitance that is generated between the electrode 15 and the two-dimensional carrier 102 is reduced. This parasitic capacitance is in inverse proportion to the distance between the electrode 15 and the two-dimensional carrier 102. According to the present embodiment, by employing a structure in which the electrode 15 is in contact with the two-dimensional carrier 102, or in which a tunnel current is made to flow between the electrode 15 and the two-dimensional carrier 102, the aforementioned parasitic capacitance can be reduced and the high frequency characteristics of the semiconductor device 1a can be improved.

Figure 5:
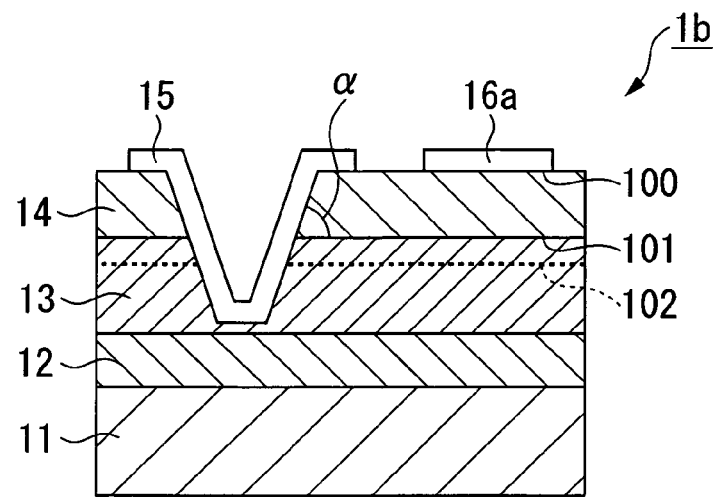
FIG. 5 is a cross-sectional view showing the cross-sectional structure of a semiconductor device according to the second embodiment of the present invention.

Next, the second embodiment of the present invention will be described. FIG. 5 shows the cross-sectional structure of a semiconductor device 1b of the present embodiment. In FIG. 5, the same symbols are used for structure that is the same as in FIG. 1 and a description thereof is omitted. In the present embodiment, a concave portion is not formed in the semiconductor layer 14 directly below an electrode 16a that forms a low resistance contact with the semiconductor layer 14. However, because the electrode 15 is in direct contact with the two-dimensional carrier 102, in the same way as the semiconductor device 1a of the first embodiment, it is possible to obtain effects such as improving the forward characteristics. However, because the electrode 16 also is in direct contact with the two-dimensional carrier 102 in the semiconductor device 1a, the forward voltage is lower in the semiconductor device 1a than in the semiconductor device 1b.

Because it is desirable that the resistance value between the electrode 16a and the two-dimensional carrier 102 is as low as possible, it is desirable that the thickness of the semiconductor layer 14 be 50 nm or less. It is more desirable that the thickness be 30 nm or less, and even more desirable that the thickness be 20 nm or less.

Figure 6:
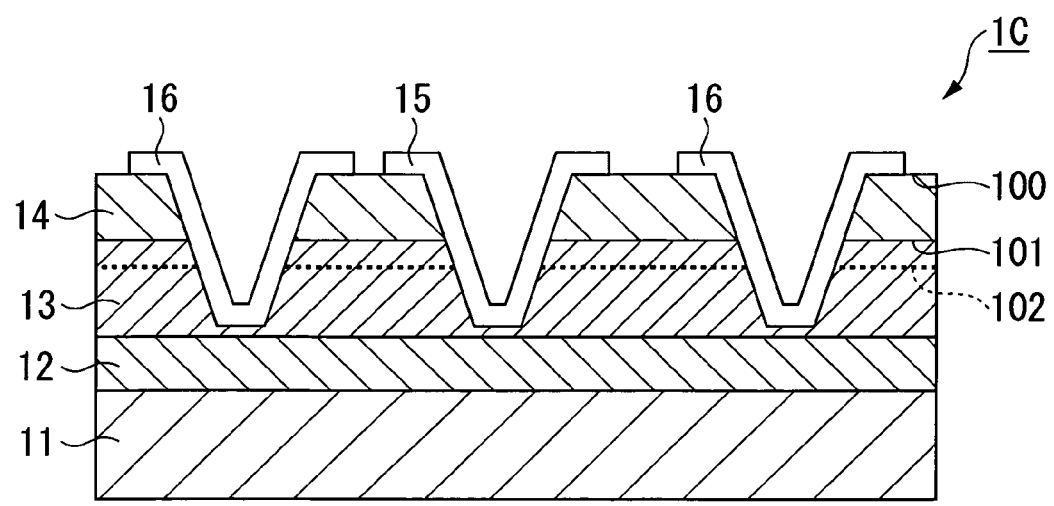
FIG. 6 is a cross-sectional view showing the cross-sectional structure of a semiconductor device according to the third embodiment of the present invention.
Figure 7A:
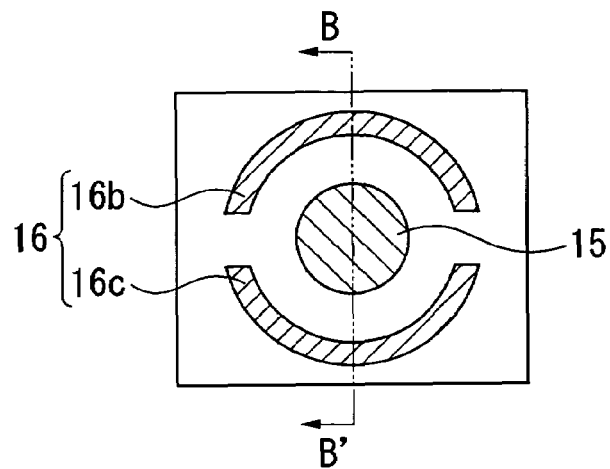
FIG. 7A is a schematic plan view of the semiconductor device according to the third embodiment of the present invention.
Figure 7B:
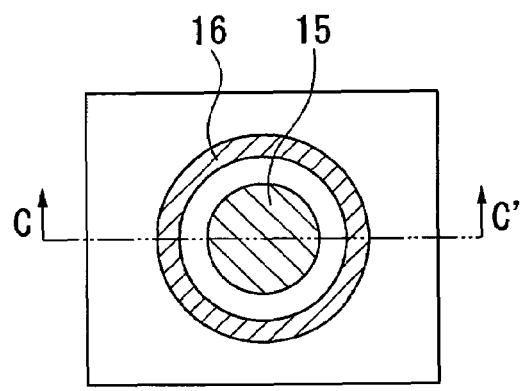
FIG. 7B is a schematic plan view of the semiconductor device according to the third embodiment of the present invention.
Figure 7C:
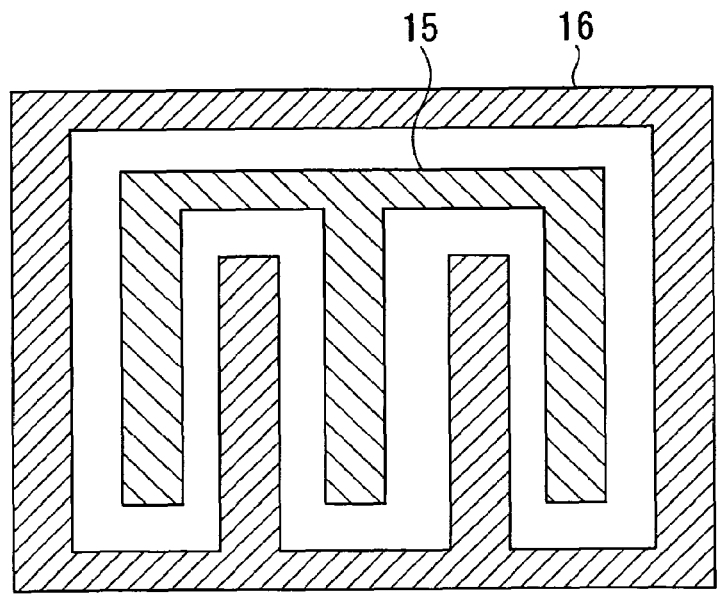
FIG. 7C is a schematic plan view of the semiconductor device according to the third embodiment of the present invention.

Next, the third embodiment of the present invention will be described. FIG. 6 shows the cross-sectional structure of a semiconductor device 1c of the present embodiment. In the present embodiment, electrodes 16 are formed so as to sandwich the electrode 15. FIG. 7 is a schematic plan view as seen from a perpendicular direction relative to the primary surface 100 of the semiconductor device 1c. In FIG. 7A, the electrode 16 is separated into an electrode 16b and an electrode 16c, and the electrodes 16b and 16c are formed so as to sandwich and face the electrode 15. FIG. 6 is a cross section taken along a line segment B-B'. In FIG. 7B, the electrode 16 is formed so as to surround the electrode 15. FIG. 6 is a cross section taken along a line segment C-C'. The electrodes 15 and 16 may also be formed in the configuration shown in FIG. 7C.

In FIGS. 7A, 7B, and 7C, the electrode 15 is a Schottky electrode and the electrodes 16, 16b, and 16c are ohmic electrodes, however, a structure that is the reverse of this may also be employed. Moreover, the number of electrodes 15 and 16 is not limited to the numbers shown in FIGS. 7A, 7B, and 7C. Furthermore, the shape of the electrodes is not limited to the shapes shown in FIGS. 7A, 7B, and 7C. According to the present embodiment, by employing a structure in which the electrodes 16 sandwich and face the electrode 15, or a structure in which the electrode 16 surrounds the electrode 15, as seen from a perpendicular direction relative to the primary surface 100, compared with when the electrodes are formed in the configuration shown in FIG. 3, it is possible to lower the on-resistance of the semiconductor device and the surface area of the current path can be increased. As a result, the forward voltage can be lowered and the current carrying capacity can be increased without the chip surface area being increased.

Figure 8:
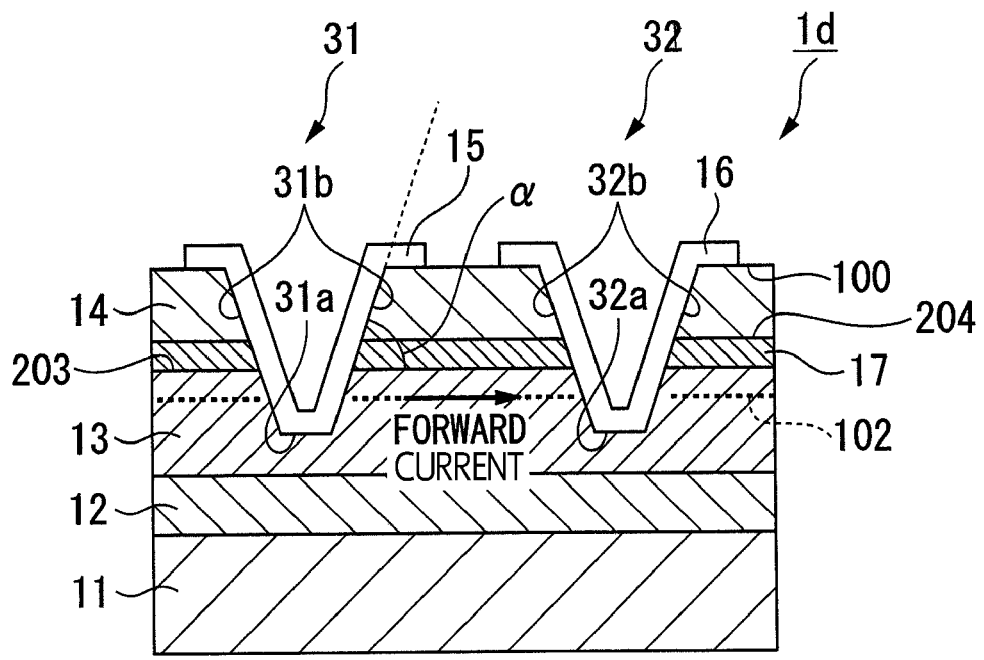
FIG. 8 is a cross-sectional view showing the cross-sectional structure of a semiconductor device according to the fourth embodiment of the present invention.

Next, the fourth embodiment of the present invention will be described. FIG. 8 shows the cross-sectional structure of a semiconductor device 1d of the present embodiment. In FIG. 8, the same symbols are used for structure that is the same as in FIG. 1 and a description thereof is omitted. In the present embodiment, between the semiconductor layer (i.e., the first semiconductor layer) 13 that is formed from GaN or the like and the semiconductor layer (i.e., the second semiconductor layer) 14 that is formed by a nitride semiconductor such as $Al_XGa_{1-X}N$ ($0<X\leq1$) and whose band gap energy is greater than that of the semiconductor layer 13 is sandwiched a semiconductor layer (i.e., a third semiconductor layer) 17 that is formed from $Al_YGa_{1-Y}N$ ($0<Y\leq1$, $X<Y$) and that is thinner than the semiconductor layer 13 and the semiconductor layer 14. A high density two-dimensional carrier 102 is generated by the effects of spontaneous polarization and piezoelectric polarization within an area of the semiconductor layer 13 that is adjacent to an interface 203 between the semiconductor layer 17 and the semiconductor layer 13. In addition, it is desirable that the semiconductor layer 17 is 50 angstroms or less, and even more desirably is between approximately 5 to 20 angstroms.

A concave portion 31 (i.e., a first concave portion) and a concave portion 32 (i.e., a second concave portion) are formed on a primary surface 100 of the semiconductor layer 14 that faces the semiconductor layer 17.

Electrodes (i.e., the first electrode 15 and the second electrode 16) are formed respectively on the bottom surface 31a of the concave portion 31 and the bottom surface 32a of the concave surface 32. It is desirable that the bottom surface 31a of the concave portion 31 and the bottom surface 32a of the concave portion 32 are formed so as to reach from the primary surface 100 as far as the two-dimensional carrier 102. Note that even if the bottom surface 31a and the bottom surface 32a are not formed so as to reach the two-dimensional carrier 102, if they are formed so as to reach the interface 203, current flows between the bottom surfaces 31a and 32a and the two-dimensional carrier 102 due to a tunnel effect. As a result, the effect of the present invention (described below) can be achieved. Moreover, if the semiconductor layer 17 has a sufficient thickness for a current to flow due to a tunnel effect (i.e., a thickness that makes a quantum mechanical tunnel effect possible), then even if the bottom surface 31a and the bottom surface 32a are not formed so as to reach the two-dimensional carrier 102, if they are formed so as to reach an interface 204 between the semiconductor layer 17 and the semiconductor layer 14, the effect of the present invention (described below) can be achieved due to a tunnel effect. In addition, the depth of the bottom surface 31a of the concave portion 31 may be different from the depth of the bottom portion 32a of the concave portion 32. For example, the bottom surface 31a of the concave portion 31 may reach as far as the interface 203, while the bottom surface 32a of the concave portion 32 may reach as far as the two-dimensional carrier 102.

An electrode 15 (i.e., a first electrode) that is made from metal and forms a Schottky junction with each of the semiconductor layers (i.e., the semiconductor layer 14 and the semiconductor layer 17 in the example shown in FIG. 8) that are in contact with the concave portion 31 is formed on the bottom surface 31a and side surfaces 31b of the concave portion 31. An electrode 16 (i.e., a second electrode) that is made from metal and forms a low resistance contact with each of the semiconductor layers (i.e., the semiconductor layer 14 and the semiconductor layer 17 in the example shown in FIG. 8) that are in contact with the concave portion 32 is formed on the bottom surface 32a and side surfaces 32b of the concave portion 32.

Note that it is desirable that, in the same way as in the first embodiment, an angle α between a side surface 31b of the concave portion 31 and the interface between the semiconductor layer 13 and the semiconductor layer 17 is between 10° and 90°.

Figure 9:
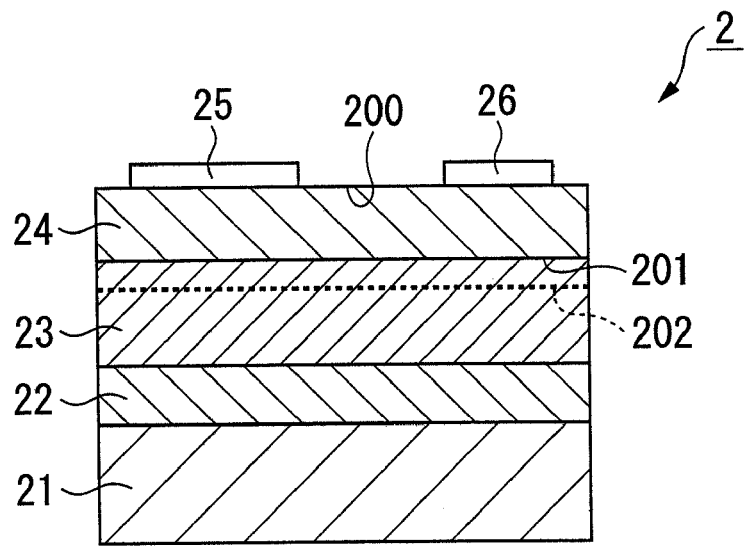
FIG. 9 is a cross-sectional view showing the cross-sectional structure of a conventional semiconductor device.

Next, a description will be given of the operation of the semiconductor device 1d of the fourth embodiment of the present invention. When voltage is applied in the forward direction, in the same way as in the first embodiment, current flows from the electrode 15 to the two-dimensional carrier 102 to the electrode 16. Generally, the mobility of the two-dimensional carrier 102 is further improved as a result of the semiconductor layer 17 being sandwiched between the semiconductor layer 14 and the semiconductor layer 13 that form a hetero interface, and it is possible to keep the resistance value of the current flowing through the semiconductor layer at a low value. This effect is greater as the AL density is higher (i.e., the Y in the $Al_YGa_{1-Y}N$). The reason for this is thought to be because the semiconductor layer 17 enables the effects of alloy diffusion of the semiconductor layer 14 to be suppressed. Even in a conventional structure such as that shown in FIG. 9, the above described effect is obtained if the semiconductor layer 17, which has a greater AL density (i.e., the Y in the $Al_YGa_{1-Y}N$) than the semiconductor layer 24, is sandwiched between the semiconductor layer 23 and the semiconductor layer 24. However, because the current flowing through the semiconductor device 2 flows from the semiconductor layer 24 to the semiconductor layer 17 to the two-dimensional carrier 202 to the semiconductor layer 17 to the semiconductor layer 24, conversely, a rise ends up occurring in the forward voltage due to the current flowing through the semiconductor layer 17. In particular, AlN (Y=1 in $Al_YGa_{1-Y}N$) is known as being non-conductive and, conversely, there is often a rise in the forward voltage.

According to the semiconductor device 1d of the present invention, because the first electrode 15 and the second electrode 16 are formed on top of a concave portion that has been hollowed out to reach the two-dimensional carrier 102, the current flows from the electrode 15 to the two-dimensional carrier 102 to the electrode 16. Accordingly, it is possible to solve the problem of the forward voltage being increased by the sandwiching of the semiconductor layer 17. As is described above, in the fourth embodiment, in addition to the effects of the first embodiment, it is possible to further reduce the forward voltage. In addition, this effect is enhanced as the density of the Al that is contained in the semiconductor layer 17 (i.e., the Y in the $Al_YGa_{1-Y}N$) is increased. In particular, the effect of reducing the forward voltage is in greatest evidence when the semiconductor layer 17 is AlN.

Conversely, when voltage is applied in the reverse direction in the semiconductor device 1d, in the same way as in the first embodiment, the electrical contact between the two-dimensional carrier 102 and the electrode 15 is broken, and it becomes difficult for current to flow between the two-dimensional carrier 102 and the electrode 15. Accordingly, according to the semiconductor device 1d of the fourth embodiment, excellent voltage resistance characteristics can be ensured while an even lower forward voltage is maintained.

Note that it is also possible for the semiconductor layer 17 of the fourth embodiment to be formed in the semiconductor devices of the second and third embodiments as well.

In all of the above described embodiments, metal materials that show Schottky characteristics towards the semiconductor layers 13 and 14 including various metals such as titanium (Ti), tungsten (W), gold (Au), silver (Ag), nickel (Ni), palladium (Pd), platinum (Pt), and copper (Cu), or alloys obtained by combining together any of these are suitable for the material of the electrode 15. Moreover, all metal materials and alloys such as AlTi that provide a low resistance contact with a GaN layer are suitable for the material of the electrodes 16, 16a, 16b, and 16c.

The nitride semiconductor may be formed by injecting a variety of impurities such as an N-type or P-type dopants, protons, oxygen, iron, and the like. In FIGS. 1, 5, 6, and 8, the substrate 11 has been provided, however, it is not essential for the substrate 11 to be provided.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

INDUSTRIAL APPLICABILITY

A favorable example of the application of the present invention is its use in semiconductor devices having a Schottky electrode structure.

The invention claimed is:

1. A semiconductor device comprising:
a first semiconductor layer that is formed from a first semiconductor material;
a second semiconductor layer that is formed from a second semiconductor material on the first semiconductor layer;
a two-dimensional carrier that is formed within the first semiconductor layer and in the vicinity of an interface between the first semiconductor layer and the second semiconductor layer;
a first concave portion that is formed penetrating at least the second semiconductor layer from a primary surface, which is a top surface, of the second semiconductor layer, and is formed from the interface to a predetermined depth in the first semiconductor layer;
a first electrode that is formed on a bottom surface and side surface of the first concave portion and that forms a Schottky junction to the semiconductor layers which contact the bottom surface and the side surface of the first concave portion; and
a second electrode that is formed in an area of the second semiconductor layer that is located away from the first electrode and that forms a low resistance contact with the second semiconductor layer,
wherein:
the primary surface of the second semiconductor layer faces the interface between the first semiconductor layer and the second semiconductor layer;
the first semiconductor material and the second semiconductor material generate a piezoelectric polarization by distortion that is generated by the difference in the lattice constant between the first semiconductor layer and the second semiconductor layer; and
the side surface of the first concave portion is inclined against the interface so that the inclination changes the thickness of the second semiconductor layer.

2. A semiconductor device comprising:
a first semiconductor layer that is formed from a first semiconductor material;
a second semiconductor layer that is formed from a second semiconductor material on the first semiconductor layer;
a two-dimensional carrier that is formed within the first semiconductor layer and in the vicinity of an interface between the first semiconductor layer and the second semiconductor layer,
a first concave portion that is formed from a primary surface, a top surface, of the second semiconductor layer reaching at least the interface, and is formed to a distance that allows a quantum mechanical tunnel effect with the two dimensional carrier to be obtained;
a first electrode that is formed on a bottom surface and a side surface of the first concave portion and also formed on the primary surface of the second semiconductor layer surrounding the first concave portion, and that forms a Schottky junction to the semiconductor layers which contact therewith; and
a second electrode that is formed in an area of the second semiconductor layer that is located away from the first electrode and that forms a low resistance contact with the second semiconductor layer,
wherein:
the primary surface of the second semiconductor layer faces the interface between the first semiconductor layer and the second semiconductor layer;
the first semiconductor material and the second semiconductor material generate a piezoelectric polarization by distortion that is generated by the difference in the lattice constant between the first semiconductor layer and the second semiconductor layer; and
the side surface of the first concave portion is inclined against the interface so that the inclination changes the thickness of the second semiconductor layer.

3. A semiconductor device comprising:
a first semiconductor layer that is formed from a first semiconductor material;
a second semiconductor layer that is formed from a second semiconductor material above the first semiconductor layer;
a third semiconductor layer that is sandwiched between the first semiconductor, layer and the second semiconductor layer and that is formed having a thickness that allows a quantum mechanical tunnel effect to be obtained;
a two-dimensional carrier that is formed within the first semiconductor layer and on the third semiconductor layer side of the first semiconductor layer;
a first concave portion that is formed penetrating at least the second semiconductor layer from a primary surface, which is a top surface, of the second semiconductor layer, and is formed from a first interface between the third semiconductor layer and the second semiconductor layer to a predetermined depth in the first semiconductor layer;
a first electrode that is formed on a bottom surface and side surface of the first concave portion and that forms a Schottky junction with the semiconductor layers which contact the bottom surface and the side surface of the first concave portion; and
a second electrode that is formed in an area of the second semiconductor layer that is located away from the first electrode and that forms a low resistance contact with the second semiconductor layer,
wherein:
the first semiconductor material and the second semiconductor material generate a piezoelectric polarization by distortion that is generated by the difference in the lattice constant between the first semiconductor layer and the second semiconductor layer; and
the side surface of the first concave portion is inclined against a second interface between the first semiconductor layer and the third semiconductor layer, and is inclined against the first interface between the third semiconductor layer and the second semiconductor layer.

4. The semiconductor device according to any one of claims 1 to 3, wherein there is further provided a second concave portion that is formed from the primary surface of the second semiconductor layer penetrating at least the second semiconductor layer, and is formed from the interface to a predetermined depth in the first semiconductor layer, and wherein
the second electrode is formed on a bottom surface and side surface of the second concave portion, and forms a low resistance contact with the semiconductor layers which contact the bottom surface and side surface of the second concave portion.

5. The semiconductor device according to any one of claims 1 to 3, wherein the second electrode is formed from the primary surface of the second semiconductor layer to the two-dimensional carrier.

6. The semiconductor device according to any one of claims 1 to 3, wherein, when viewed from a perpendicular direction relative to the primary surface, the second electrode surrounds the first electrode, and the inner surface of the second electrode is formed so as to face the outer surface of the first electrode.

7. The semiconductor device according to any one of claims 1 to 3, wherein, when viewed from a perpendicular direction relative to the primary surface, the second electrode is formed so as to surround the first electrode.

8. The semiconductor device according to claim 1 or claim 3, wherein the first electrode is also formed on the primary surface of the second semiconductor layer that surrounds the first concave portion.

9. The semiconductor device according to any one of claims 1 to 3, wherein a forward current passes from the first electrode to the second electrode when a voltage is applied from the first electrode to the second electrode, and a reverse current passing from the second electrode to the first electrode is restricted when the voltage is applied from the first electrode to the second electrode.

10. The semiconductor device according to any one of claims 1 to 3, wherein an inclination angle of the side surface of the first concave portion is equal to or greater than 10 degrees, and smaller than 90 degrees.

* * * * *